United States Patent [19]

Heist et al.

[11] Patent Number: 4,678,310
[45] Date of Patent: Jul. 7, 1987

[54] DEVICE FOR TREATING PRINTING PLATES WITH A FLUID

[75] Inventors: Hans Heist, Wiesbaden; Dieter Toepfer, Heidenrod; Sylvia Britzke, Wiesbaden, all of Fed. Rep. of Germany

[73] Assignee: Hoechst Aktiengesellschaft, Frankfurt am Main, Fed. Rep. of Germany

[21] Appl. No.: 783,958

[22] Filed: Oct. 4, 1985

[30] Foreign Application Priority Data

Oct. 11, 1984 [DE] Fed. Rep. of Germany ....... 3437329

[51] Int. Cl.$^4$ ..................... G03D 3/06; G03D 13/00
[52] U.S. Cl. ..................................... 354/319; 354/324
[58] Field of Search ............... 354/317, 319, 324, 320, 354/321, 322

[56] References Cited

U.S. PATENT DOCUMENTS

| 3,635,144 | 1/1972 | Beck | 354/317 |
| 3,732,808 | 5/1973 | Graham | 101/463 |
| 3,738,249 | 6/1973 | Schichlein | 95/89 R |
| 4,081,815 | 3/1978 | Horner | 354/319 |
| 4,145,135 | 3/1979 | Sara | 354/324 |
| 4,187,023 | 2/1980 | Schausberger et al. | 354/321 |
| 4,327,988 | 5/1982 | Vanhorebeek et al. | 354/324 |

FOREIGN PATENT DOCUMENTS 7816229 5/1978 Fed. Rep. of Germany .
2823773 12/1979 Fed. Rep. of Germany .

Primary Examiner—A. A. Mathews
Attorney, Agent, or Firm—Schwartz, Jeffery, Schwaab, Mack, Blumenthal & Evans

[57] ABSTRACT

A device for treating printing plates with a fluid. A flooded trough has a bottom, two lateral boundary walls and containment blades, one blade located on each of the inlet and outlet sides of the trough. The bottom carries a plate guide table with the bottom. Feed branches are releasably inserted into holder pipes leading from the overflow channel to a feed line having a T-branch. The feed line is connected via a pump to a tank, the latter used as a stock vessel for the fluid. The holder pipes are taken through an inclined bottom of a collecting trough which surrounds the flooded trough, and are rigidly joined to the inclined bottom. Baffles are provided in the overflow channel above the inlet openings of the feed branches. The fluid flows into the flooded trough through the feed line, and flows out by overflow into the collecting trough, then to the stock vessel, and thereafter is recirculated by the pump.

13 Claims, 3 Drawing Figures

DEVICE FOR TREATING PRINTING PLATES WITH A FLUID

BACKGROUND OF THE INVENTION

The invention relates to a device for treating printing plates with a fluid, the printing plates being passed horizontally through a flooded trough composed of a bottom, two lateral boundary walls and containment elements located on each of the inlet and outlet sides.

German Utility Model No. 7,141,280 has disclosed a device for treating printing plates with one or more baths which contain the treatment fluids and through which and over the bottom of which the printing plates are passed by means of conveyor rollers. In particular, the baths are contained by the flat horizontal bottom, containment brushes on the inlet and outlet sides, and lateral boundary walls. Whereas normally a containment brush with only one row of bristles is sufficient for containing the cleansing water bath, the containment brushes for containing the developer bath are provided with rows of bristles, which are located one after the other in the direction in which the plates pass through. In order to minimize the losses of developer fluid, a rubber scraper is also provided on the outlet side, downstream of the containment brush as viewed in the direction of the plates passing through. A first pair of conveyor rollers upstream of the containment brushes and a second pair of conveyor rollers downstream of the containment brushes serve for transporting the printing plates through the bath.

German Offenlegungsschrift No. 2,461,120 describes a device for the treatment of material in the form of sheets, the device having a pre-soaking chamber with an upper and a lower guide plate. The pre-soaking chamber can be open or closed at the sides. For feeding the developer solution into the pre-soaking chamber, two lines are used which are arranged perpendicular to the direction of transport of the printing plates and are connected to the pre-chamber, so that the treatment fluid which is fed in covers the entire width of the introduced material in the form of sheets. The material introduced into the pre-soaking chamber is flooded, between the fluid plates, with developer solution which is fed in through the developer feed lines. This causes turbulence in the developer bath and, since the surfaces of the printing plate come into direct contact with the developer flowing in, the turbulence has disadvantageous effects on the surfaces which are to be developed. In the case of sensitive printing plates, in particular positive printing plates, a cloudy surface development can result. The cloudy surface development is not removed even by subsequent brushing steps with rotating brush rollers. In a modification of this developing device, it is known to spray the developer fluid through developer spray nozzles onto the printing plates being transported through the device. In the case of applying the developer by means of spray tubes or spray nozzles, however, the result is a more or less extensive streaky surface development in the case of particularly sensitive printing plates, in particular positive printing plates.

German Auslegeschrift No. 2,250,278 has disclosed a device for treating printing plates with a fluid, which device comprises a fixed lower part and an upper part which is pivotable about a horizontal axis relative to the former. Two pairs of rollers are provided. The lower roller of each pair of rollers is located in the fixed lower part, whereas the tiltable upper part carries the upper roller of each pair.

German Offenlegungsschrift No. 2,238,414 relates to an apparatus for the simultaneous development of mutually opposite surfaces of planographic printing plates and has a feed device for transporting the planographic printing plate through a developing station which has an upper and a lower plate arranged at a mutual spacing. Between the upper and the lower plates, side walls bounding a developing chamber are arranged at a mutual spacing in such a way that the developing chamber is aligned along the path of movement of the planographic printing plate through the apparatus. At an inlet end of the developing chamber, flexible membranes form a fluid-tight seal and, at the outlet end, the chamber is provided with a throttle which restricts the fluid flow. For filling the developing chamber, the developer fluid is pumped in under uniform pressure from above and from below in such a way that the surfaces of the planographic printing plate come into direct contact with the developer flowing in, so that turbulence is generated on the surfaces of the printing plate which are to be developed. In the case of sensitive positive printing plates, this turbulence can cause cloudy surface development.

German Utility Model No. 7,816,229 relates to a device for treating positive printing plates with a fluid, this device comprising a tank which contains the treatment fluid as the bath and is composed of a bottom, two lateral boundary walls and at least one backing-up element on each of the inlet and outlet sides. The printing plates are transported horizontally through the treatment fluid on the bottom of the tank. The treatment fluid is introduced into the tank via a spray tube and, between the spray tube and the bottom, a baffle is located which prevents direct spraying of the developer fluid onto the surface of the printing plate which is to be developed. The risk of streaky surface development of the printing plate is thus reduced.

In the state of the art, when the treatment fluid is fed into the treatment bath by means of spray tubes, it is in general necessary to incur a certain constructional outlay, such as, for example, the incorporation of baffles between the spray nozzles and the fluid bath, in order to avoid turbulence with its disadvantageous consequences for the development of printing plates. As a result, maintenance and repair work then also become more extensive, since such parts, for example baffles, must be dismantled in order to gain access to the lower transport rollers for the printing plates.

DISCLOSURE OF THE INVENTION

It is accordingly an object of the invention to provide a device for treating printing plates with a fluid without the use of spray tubes.

It is another object of the invention to provide a device, as above, having reduced cleaning costs.

It is yet another object of the invention to provide a device, as above, in which the parts to be cleaned can be removed without the use of tools.

These objects are achieved by a device for treating printing plates which comprises (1) a flooded trough having an inlet side and an outlet side and including a bottom comprising a guide plate table and an overflow channel extending around the table and integral therewith, a pair of side walls, a separate wall located at each of the inlet side and outlet side of the flooded trough, and a pair of containment elements, a separate containment element supported on a separate side wall; (2) means for feeding fluid to the flooded trough; (3) a collecting trough for receiving overflow of fluid from the flooded trough; and (4) means for releasable and rigid engagement of the fluid feeding means to a bottom portion of the collecting trough, wherein a printing plate passes horizontally through the flooded trough.

BRIEF DESCRIPTION OF THE DRAWINGS

The invention is explained in more detail below by reference to an illustrative embodiment shown in the drawings, in which.

DETAILED DESCRIPTION OF THE PREFERRED EMBODIMENTS

In one embodiment of the invention, a pair of holder pipes form the ends of pipe sections of a feed line which has a T-branch and is connected to the delivery side of a pump. A seal in the form of an O-ring or sleeve, into which the respective feed branch of the flooded trough is inserted, is fitted on the inner walls of each of the holder pipes.

The invention has the advantages that the developing device is constructed without spray tubes, the developer bath which accumulates between inlet and outlet blades being fed in without turbulence from below through the overflow channel of the flooded trough and, after switching off, running back into the stock tank through the same line via the pump.

The developer bath is accumulated between the inlet and outlet blades, and the excess developer flows over the lateral boundaries into the collecting trough and from the latter into the stock tank, so that there is continuous renewal of developer. Disregarding the cover of the flooded trough, which is hardly contaminated, only three components, all of which are inserted into guides or pipe branches with seals, then have to be removed for cleaning. This work does not require any tools.

Figure 1:
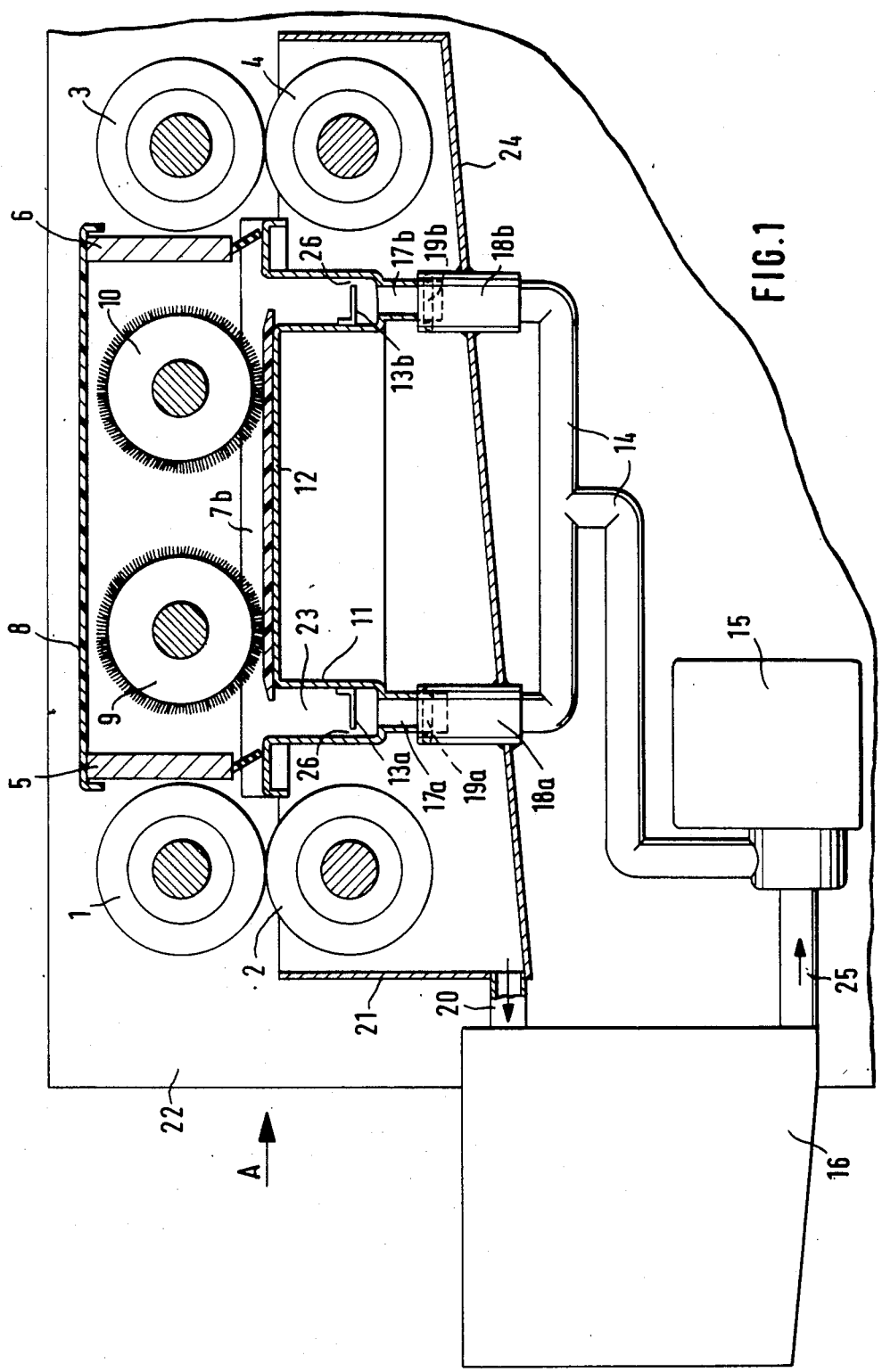
FIG. 1 is a diagrammatic section through a device according to the invention, with brush rollers, for developing negative printing plates.

The device shown diagrammatically in FIG. 1 has a pair of inlet rollers and a pair of outlet rollers which, for horizontal transport of plate-shaped materials such as printing plates in the passage direction A, are arranged with their axes horizontal. A lower inlet roller 2 and a lower outlet roller 4 of each pair of rollers are mounted in side plates 22, between which a collecting trough 21 is provided, the lateral boundary walls (not shown in FIGS. 1 and 2); of which are recessed in the region of the axle stubs of the rollers 2, 4. An upper inlet roller 1 and an upper outlet roller 3 are mounted in side plates 22 of the device. The pairs of inlet and outlet rollers are located, respectively, upstream of the inlet and downstream of the outlet of a flooded trough 11, as viewed in the passage direction A, and within the collecting trough 21 which surrounds the flooded trough 11. The flooded trough 11 is composed of a bottom comprising a plate guide table 12 and an overflow channel 23 which extends around the table 12 and is integral therewith or with the bottom.

The plate guide table 12 can, for example, be a corrugated PVC material which is adhesively bonded to the bottom and the front and rear edges of which are chamfered. The overflow channel 23 surrounds the plate guide table 12 like a rectangle and has fluid-feed branches 17a and 17b on each of the inlet and outlet sides respectively. The feed branches 17a and 17b extend downwardly and are releasably inserted into holder tubes 18a and 18b which are taken through a bottom 24 of the collecting trough 21 and are rigidly joined to this bottom, for example, by welding or adhesive bonding.

The side walls of the overflow channel 23 on the inlet and outlet sides are each angled off horizontally and form the support surfaces of the bottom for a front containment blade 5 and a rear containment blade 6. The support surfaces of the bottom are aligned in the passage direction A with the surface of the plate guide table 12.

A seal 19a and 19b is fitted on the inner walls of each of the holder pipes 18a and 18b, the respective feed branches 17a and 17b of the flooded trough 11 being inserted into these seals. The seals are, for example, O-rings or sleeves which are adhesively bonded to the inner walls of the holder pipes or fit tightly into seats recessed in the inner walls. The flooded trough 11, comprising the bottom with the plate guide table 12, the two lateral side walls and the containment elements, located on each of the inlet and outlet sides in the form of the containment blades 5 and 6, can be released without the use of tools from its plug-in connection to the holder pipes 18a and 18b. The two holder pipes 18a and 18b form the ends of pipe sections of a feed line 14 for the developer fluid, which line has a T-branch and is connected to the delivery side of a pump 15 located outside and below the collecting trough 21. The suction side of the pump 15 is connected via a line 25 to a tank 16 utilized as a stock vessel for the developer fluid. The feed of developer fluid to the flooded trough 11 and its outflow from the latter take place in each case via the feed branches 17a, 17b and the feed line 14 as well as via the line 25 from and to the tank 16. Via the line 25 and the feed line 14, the tank 16 and the flooded trough 11 form communicating vessels. Furthermore, the tank is connected via a tank inlet 20 to the lowest point of the bottom 24 of the collecting trough 21. The bottom 24 of the collecting trough 21 is inclined relative to the horizontal and rises in the direction of the outlet side of the printing plates.

Above the inlet openings of the feed branches 17a and 17b in the overflow channel 23, there are baffles 13a and 13b which, except for a gap 26, fill the cross-section of the overflow channel 23. These baffles 13a and 13b ensure that no turbulence, which could cause an undesirable streaky surface development of the printing plates, can arise in the developer fluid flowing into the flooded trough 11.

The flooded trough 11 is closed by a cover 8 which is made, for example, from plastic and which, without being fixed at any point, rests on the containment blades 5 and 6, located on the inlet and outlet sides, and on the lateral boundary walls of the flooded trough 11. In FIG. 1, two brush rollers 9 and 10, the brushes of which are in contact with the surface of the plate guide table 12, are also provided in the interior of the flooded trough 11. Some brush rollers are in general necessary for the development of negative printing plates, since the negative printing plates sometimes contain binders which the developer fluid cannot dissolve and which must therefore be removed mechanically by the brush rollers. In more recently developed negative printing plates, the binders are also soluble in the developer fluid, so that brush rollers can then be omitted.

Figure 2:
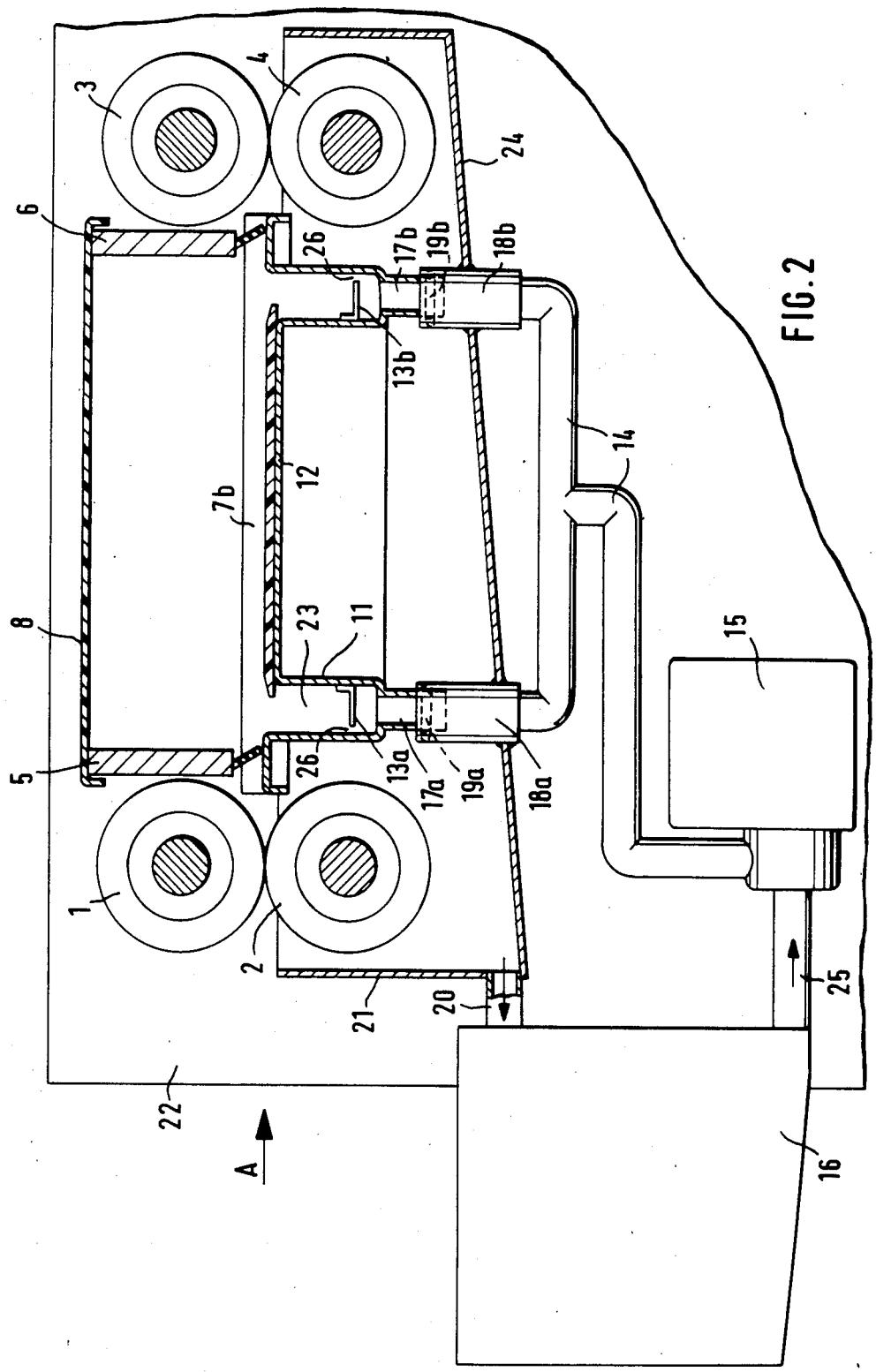
FIG. 2 is a diagrammatic section, similar to FIG. 1, through a device according to the invention, which does not have any brush rollers and is suitable for processing positive printing plates.

The embodiment of the developing device, as shown diagrammatically in a sectional view in FIG. 2, is suitable for developing positive printing plates. Except for the missing brush rollers, this embodiment is identical to the embodiment according to FIG. 1, so that it is unnecessary to describe the individual components and assemblies of this embodiment once more. Since the binders used for positive printing plates are different from those for negative printing plates and these binders are largely dissolved by the developer fluid, brushing of the positive printing plates and hence also the brush rollers are unnecessary.

Figure 3:
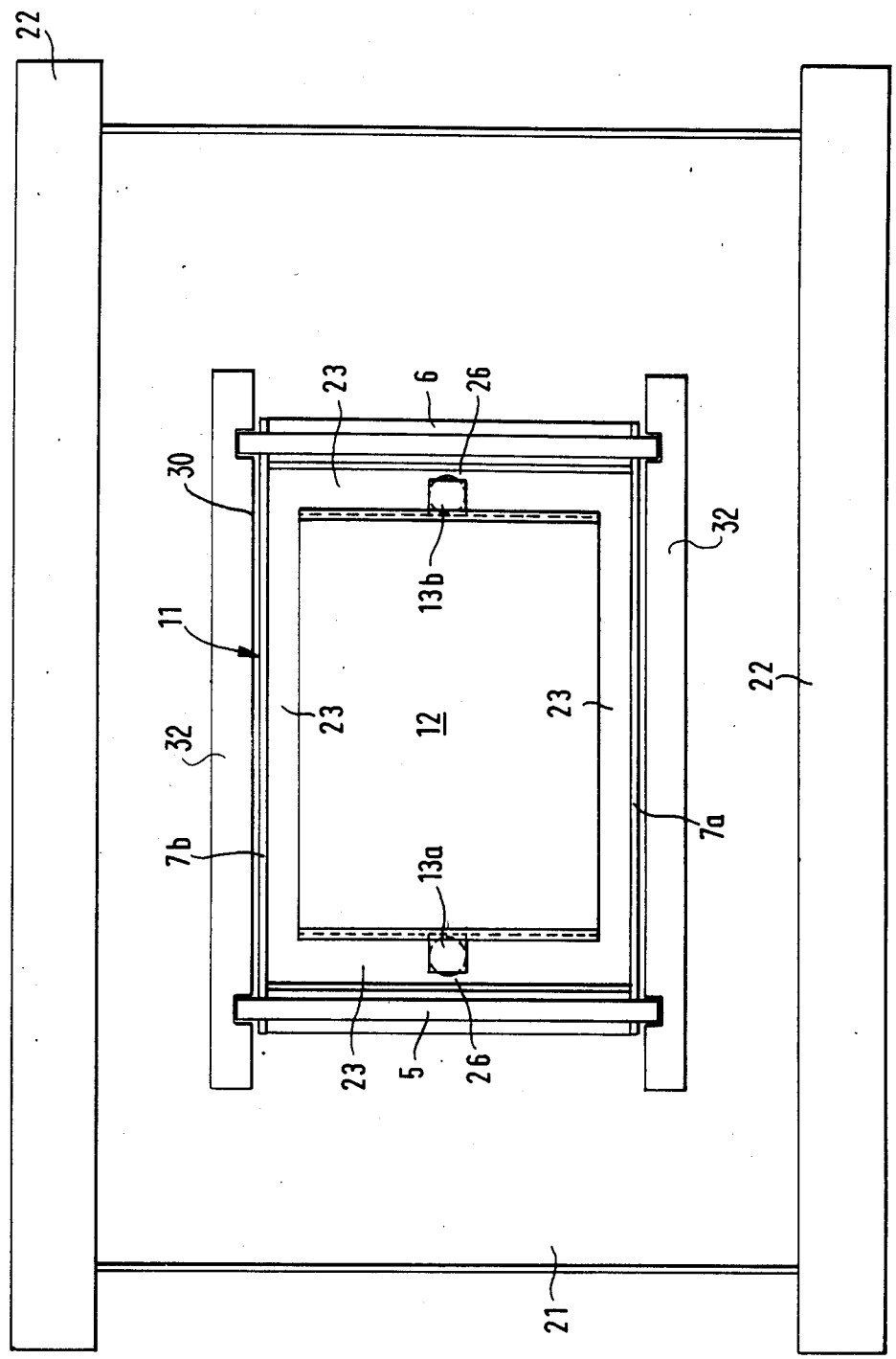
FIG. 3 is a diagrammatic plan view of a device according to the invention, the cover and the pairs of inlet and outlet rollers not being shown in order to give a clearer illustration.

FIG. 3 shows a diagrammatic plan view of the device according to FIG. 1 or FIG. 2, the cover and the pairs of inlet and outlet rollers being omitted in order to give a clearer illustration. The flooded trough 11 has lateral side walls 7a and 7b which are aligned parallel to the passage direction A of the printing plates. These lateral side walls 7a and 7b bound the overflow channel 23 which extends around the plate guide table 12 and are separated by a gap 30 from the lateral boundary walls 32 of the flooded trough 11. The excess developer fluid which exceeds the height of the lateral side walls 7a and 7b can flow out through this gap into the collecting trough 21. As can be seen from FIG. 3, the front and rear containment blades 5 and 6 are inserted in the lateral boundary walls 32 of the flooded trough 11. Moreover, the baffles 13a and 13b above the access openings of the feed branches 17a and 17b are shown.

For cleaning the device, three components are lifted off, namely the cover 8, the containment blades 5 and 6, and the flooded trough 11. These components can be removed without the use of tools. After the flooded trough 11 has been lifted off, the lower inlet roller 2 and the lower outlet roller 4 as well as the bottom 24 of the collecting trough 21 are freely accessible for cleaning work.

What is claimed is:

1. A device for treating printing plates, comprising:
   (1) a flooded trough having an inlet side and an outlet side and including:
      a bottom comprising a guide plate table and an overflow channel extending around said table and being integral therewith;
      a pair of side walls, a separate said wall located at each of said inlet side and outlet side of said flooded trough; and
      a pair of containment elements, a separate said containment element supported on a separate said side wall, whereby said trough is adapted for passage of a printing plate horizontally therethrough;
   (2) means for feeding fluid to said flooded trough;
   (3) a collecting trough, having a bottom wall and being positioned below said flooded trough, for receiving overflow of fluid from said flooded trough; and
   (4) means for releasably and rigidly engaging said fluid feeding means through the bottom wall of said collecting trough.

2. The device as claimed in claim 1, wherein said fluid feeding means includes a pair of fluid feed branches, a separate said branch positioned on each of the inlet and outlet sides and in fluid communication with said overflow channel, and wherein said engaging means includes a pair of holder pipes rigidly positioned in said bottom wall of said collecting trough, said holder pipes respectively registering with and engaging said fluid feed branches.

3. The device as claimed in claim 2, wherein said device further includes fluid circulation means.

4. The device as claimed in claim 3, wherein said fluid circulation means includes a circulation pump having a delivery side, and wherein said holder pipes are connected to the delivery side of said pump by means of a T-branch.

5. The device as claimed in claim 4, wherein a seal in the form of an O-ring or sleeve is fitted on an inner wall of each of said holder pipes, and wherein said feed branches are insertable in said holder pipes and sealingly engaged therein by means of said seals.

6. The device as claimed in claim 4, wherein said bottom wall of said collecting trough is inclined relative to the horizontal, the lowest point of said bottom wall being fluidly connected to an inlet of a stock tank, said stock tank in turn being connected to the suction inlet of said pump at a position lower than the inlet of the stock tank.

7. The device as claimed in claim 6, wherein said bottom wall rises in the direction of the outlet side of said flooded trough.

8. The device as claimed in claim 2, wherein said means for feeding fluid includes one or more baffles positioned in the overflow channel above inlet openings of each of said feed branches, said baffles substantially filling the cross-sections of said overflow channel, except for a gap.

9. The device as claimed in claim 1, wherein said collecting trough surrounds said flooded trough and wherein said device further includes a pair of inlet rollers and a pair of outlet rollers, each pair of rollers having an upper and a lower roller, the lower rollers being mounted in side plates, said side plates being parallel to the direction of passage of the printing plate.

10. The device as claimed in claim 1, wherein said flooded trough is closed by a cover, said cover being unsecured, and wherein said containment elements comprise containment blades, said cover resting on said containment blades.

11. The device as claimed in claim 1, wherein said flooded trough includes, on each side thereof parallel to the direction of passage of the printing plate, a lateral side wall, and a lateral boundary wall separated from said lateral side wall by a gap, and wherein excess fluid rising in said flooded trough above the height of said lateral side walls flows into said collection trough through said gaps.

12. The device as claimed in claim 1, wherein said device further includes at least one brush roller in contact with said plate guide table.

13. The device as claimed in claim 2, wherein the feeding and the flow-off of the fluid to and from said flooded trough are provided, respectively, through said fluid-feed branches and a feed line.

* * * * *